United States Patent
Han et al.

(10) Patent No.: US 8,039,402 B2
(45) Date of Patent: Oct. 18, 2011

(54) METHODS FOR FORMING A GATE AND A SHALLOW TRENCH ISOLATION REGION AND FOR PLANARIZATING AN ETCHED SURFACE OF SILICON SUBSTRATE

(75) Inventors: Qiuhua Han, Shanghai (CN); Haiyang Zhang, Shanghai (CN); Qingtian Ma, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 219 days.

(21) Appl. No.: 12/333,066

(22) Filed: Dec. 11, 2008

(65) Prior Publication Data
US 2009/0155977 A1 Jun. 18, 2009

(30) Foreign Application Priority Data
Dec. 13, 2007 (CN) .......................... 2007 1 0094520

(51) Int. Cl.
*H01L 21/302* (2006.01)
*H01L 21/461* (2006.01)
*H01L 21/31* (2006.01)
*H01L 21/469* (2006.01)

(52) U.S. Cl. . 438/711; 438/710; 438/786; 257/E21.218; 257/E21.274

(58) Field of Classification Search ................. 438/710, 438/711, FOR. 117, 786; 257/E21.218, E21.274
See application file for complete search history.

(56) References Cited

U.S. PATENT DOCUMENTS

| 6,723,653 B1 | 4/2004 | Kim | |
| 2007/0148979 A1* | 6/2007 | Lee et al. | 438/700 |
| 2008/0176761 A1* | 7/2008 | Menchen et al. | 506/13 |

FOREIGN PATENT DOCUMENTS

| CN | 1457503 A | 11/2003 |
| CN | 1716564 A | 1/2006 |
| CN | 1770406 A | 5/2006 |
| CN | 101075554 | 11/2007 |
| JP | 2006-165032 | 6/2006 |

* cited by examiner

*Primary Examiner* — Michelle Estrada
(74) *Attorney, Agent, or Firm* — Squire, Sanders & Dempsey (US) LLP

(57) ABSTRACT

There is provide a method for forming a gate, which can improve the etching uniformity of the sidewalls of the gate, including the following steps: forming a dielectric layer on a semiconductor substrate; forming a polysilicon layer on the dielectric layer; etching the polysilicon layer; performing an isotropic plasma etching process on the etched polysilicon layer by using a mixed gases containing a fluorine-based gas and oxygen gas; and cleaning the semiconductor substrate subjected to the isotropic plasma etching process, thereby forming a gate. there are also provided a method for forming a shallow trench isolation region, which can improve the filling quality of a subsequent spacer and the electrical properties of the resultant shallow trench isolation region by improving the etching uniformity of sidewalls and bottom surface of the shallow trench, and a method for planarizating an etched surface of silicon substrate, which can improve the etching uniformity of the surface of silicon substrate.

9 Claims, 7 Drawing Sheets

METHODS FOR FORMING A GATE AND A SHALLOW TRENCH ISOLATION REGION AND FOR PLANARIZATING AN ETCHED SURFACE OF SILICON SUBSTRATE

This application claims the priority of Chinese Patent Application No. 200710094520.3, filed Dec. 13, 2007, the entire disclosure of which is incorporated herein by reference.

FIELD OF THE INVENTION

The present invention relates to a method for forming a semiconductor device, and more particularly, to methods for forming a gate and a shallow trench isolation region and for planarizating an etched surface of silicon substrate.

DESCRIPTION OF THE RELATED ART

The manufacturing of a gate is a key step for a process for forming a semiconductor device, since the gate conventionally has a minimal physical dimension in the process of manufacturing a semiconductor device, i.e. the width of the gate conventionally is a critical dimension of the semiconductor device.

In the prior art, a method for forming a gate conventionally includes the following steps: forming a dielectric layer 20 on a semiconductor substrate 10, as shown in FIG. 1a; forming a polysilicon layer 30 on the dielectric layer 20, as shown in FIG. 1b; forming an etched resist layer 40 on the polysilicon layer 30, as shown in FIG. 1c; etching the polysilicon layer 30 by using the etched resist layer 40 as mask to form a gate 32.

As the critical dimension of the device decreases gradually, how to precisely controlling the width of a gate has become a primary problem interested by the skilled in the art. Many attempts has been tried to resolve this problem, for example, the Chinese patent publication No. CN 1855372A (disclosed on Nov. 1, 2006) discloses a method for forming a gate, in which a precise controlling for a width of the gate is achieved by avoiding horns generated on a top surface of the gate.

However, it is found in practice that a roughness 34 formed on the sidewalls of a gate also can affect the precise controlling for a width of the gate negatively in addition to the horns on the top surface, as shown in FIG. 1e. Conventionally, the roughness 34 is regarded to be formed due to a non-uniform etching during the process for forming a gate. The problem of improving the etching uniformity of sidewalls of a gate has attracted more attentions in the art.

Furthermore, shallow trench isolation (STI) process is a key process for isolating between active regions formed on a semiconductor substrate as the decrease in critical dimension of a device. The profile character of the shallow trench such as smoothness of the sidewalls and bottom surface of the shallow trench can facilitate to improve a precise controlling for the width and depth of the shallow trench isolation region, and in turn, a precise controlling for the width and depth of the shallow trench isolation region can facilitate to improve the filling quality of a subsequent spacer and the electrical properties of the resultant shallow trench isolation region.

In the art, a method for forming a shallow trench isolation region includes the following steps: forming an etched passivation layer 60 on a silicon substrate 50, as shown in FIG. 2a; etching a portion of the silicon substrate 50 by using the etched passivation layer 60 as a mask to form a shallow trench 52, as shown in FIG. 2b; and filling the shallow trench to form a shallow trench isolation region. A device active region has been defined in the silicon substrate.

However, it is found in practice that a roughness 54 is easily formed on the sidewalls of the shallow trench and it can affect the precise controlling for a width and depth of the shallow trench negatively, as shown in FIG. 2c. The roughness 54 is conventionally regarded to be formed due to a non-uniform etching during the process for forming the shallow trench. How to improve the etching uniformity of sidewalls and bottom surface of a shallow trench has attracted more attentions in the art.

SUMMARY OF THE INVENTION

An object of the present invention is to provide a method for forming a gate, which can improve the etching uniformity of the sidewalls of the gate. Another object of the present invention is to provide a method for forming a shallow trench isolation region, which can improve the filling quality of a subsequent spacer and the electrical properties of the resultant shallow trench isolation region by improving the etching uniformity of sidewalls and bottom surface of the shallow trench. Yet another object of the present invention is to provide a method for planarizating an etched surface of silicon substrate, which can improve the etching uniformity of the surface of silicon substrate.

In a first aspect of the present invention, there is provided a method for forming a gate comprising:

forming a dielectric layer on a semiconductor substrate;
forming a polysilicon layer on the dielectric layer;
etching the polysilicon layer;
performing an isotropic plasma etching process on the etched polysilicon layer by using a mixed gases containing a fluorine-based gas and oxygen gas; and
cleaning the semiconductor substrate subjected to the isotropic plasma etching process, thereby forming a gate.

Preferably, the dielectric layer can comprise silicon oxide. Preferably, the fluorine-based gas can be one or more selected from $CF_4$, $C_2F_6$, $SF_6$ and $NF_3$. If the fluorine-based gas is $CF_4$, the flow rate of which preferably can be in a range of approximately 10 sccm to 50 sccm. Preferably, the flow rate of oxygen can be in a range of approximately 100 sccm to 300 sccm. Preferably, the isotropic plasma etching process can be performed by using Inductive Coupled Plasma process with a zero bias power. Preferably, the Inductive Coupled Plasma process is performed in a CDE300 apparatus. Preferably, the isotropic plasma etching process is performed under a pressure ranging from 200 mTorr to 300 mTorr at a power ranging from 200 W to 1000 W. Preferably, the cleaning process is performed by using a wet cleaning process.

Preferably, the cleaning process is performed by the following steps:

cleaning the semiconductor substrate subjected to the isotropic plasma etching process by using a mixed aqueous solution of sulfuric acid and hydrogen peroxide or a mixed aqueous solution of sulfuric acid and ozone; and
cleaning the resultant semiconductor substrate by using a mixed aqueous solution of ammonia and hydrogen peroxide.

In a second aspect of the present invention, there is provided a method for forming a shallow trench isolation region comprising:

forming a patterned passivation layer on a silicon substrate;
etching a portion of the silicon substrate to a predetermined depth by using the patterned passivation layer as a mask;
performing an isotropic plasma etching process on the etched polysilicon layer by using a mixed gases containing a fluorine-based gas and oxygen gas;

cleaning the silicon substrate subjected to the isotropic plasma etching process, thereby forming a shallow trench; and filling the shallow trench to form a shallow trench isolation region.

Preferably, the fluorine-based gas can be one or more selected from $CF_4$, $C_2F_6$, $SF_6$ and $NF_3$. If the fluorine-based gas is $CF_4$, the flow rate of which preferably can be in a range of approximately 10 sccm to 50 sccm. Preferably, the flow rate of oxygen gas can be in a range of approximately 100 sccm to 300 sccm. Preferably, the isotropic plasma etching process can be performed by using Inductive Coupled Plasma process with a zero bias power. Preferably, the Inductive Coupled Plasma process is performed in a CDE300 apparatus. Preferably, the isotropic plasma etching process is performed under a pressure ranging from 200 mTorr to 300 mTorr at a power ranging from 200 W to 1000 W. Preferably, the cleaning process is performed by using a wet cleaning process.

Preferably, the cleaning process is performed by the following steps:

cleaning the semiconductor substrate subjected to the isotropic plasma etching process by using a mixed aqueous solution of sulfuric acid and hydrogen peroxide or a mixed aqueous solution of sulfuric acid and ozone; and cleaning the resultant semiconductor substrate by using a mixed aqueous solution of ammonia and hydrogen peroxide.

In a third aspect of the present invention, there is provided a method for planarizating an etched surface of silicon substrate comprising:

etching a silicon substrate;

performing an isotropic plasma etching process on the etched silicon substrate by using a mixed gases containing a fluorine-based gas and oxygen gas; and cleaning the silicon substrate subjected to the isotropic plasma etching process.

Preferably, the fluorine-based gas can be one or more selected from $CF_4$, $C_2F_6$, $SF_6$ and $NF_3$. If the fluorine-based gas is $CF_4$, the flow rate of which preferably can be in a range of approximately 10 sccm to 50 sccm. Preferably, the flow rate of oxygen gas can be in a range of approximately 100 sccm to 300 sccm. Preferably, the isotropic plasma etching process can be performed by using Inductive Coupled Plasma process with a zero bias power. Preferably, the Inductive Coupled Plasma process is performed in a CDE300 apparatus. Preferably, the isotropic plasma etching process is performed under a pressure ranging from 200 mTorr to 300 mTorr at a power ranging from 200 W to 1000 W. Preferably, the cleaning process is performed by using a wet cleaning process.

Preferably, the cleaning process is performed by the following steps:

cleaning the semiconductor substrate subjected to the isotropic plasma etching process by using a mixed aqueous solution of sulfuric acid and hydrogen peroxide or a mixed aqueous solution of sulfuric acid and ozone; and cleaning the resultant semiconductor substrate by using a mixed aqueous solution of ammonia and hydrogen peroxide.

In comparison with the prior art, the present invention has several advantages as following.

In the present method for forming a gate, after a polysilicon layer is etched, an isotropic plasma etching process is performed on the etched polysilicon layer by using a mixed gases containing a fluorine-based gas and oxygen gas, so that a temporary protective film of SiOF is formed from the fluorine-based gas and oxygen gas on the surface of the etched polysilicon layer during the isotropic plasma etching process, and the thickness of the temporary protective film which covers the surface of the polysilicon layer increases gradually from the convex portion of the surface of the polysilicon layer to the concave portion of the surface of the polysilicon layer, wherein the convex portion of the surface of the polysilicon layer is etched by the mixed gases containing fluorine-based gas and oxygen more easily as compared with the concave portion of the surface of the polysilicon layer. The difference of height between the convex portion and the concave portion of the surface of the polysilicon layer is reduced after the isotropic plasma etching process, thereby improving the etching uniformity of the gate sidewalls.

In the present method for forming a shallow trench isolation region, after a portion of a silicon substrate is etched by using an etched passivation layer as a mask, an isotropic plasma etching process is performed on the etched silicon substrate by using a mixed gases containing a fluorine-based gas and oxygen gas, so that a temporary protective film of SiOF is formed from the fluorine-based gas and oxygen gas on the etched interface during the isotropic plasma etching process, and the thickness of the temporary protective film which covers the surface of the etched interface increases gradually from the convex portion of the etched interface to the concave portion of the etched interface, wherein the convex portion of the etched interface is etched by the mixed gases containing the fluorine-based gas and oxygen gas more easily as compared with the concave portion of the etched interface. The difference of height between the convex portion and the concave portion of the etched interface is reduced after the isotropic plasma etching process, thereby improving the etching uniformity of the sidewalls and bottom of the shallow trench formed after a subsequent wet cleaning process, which make it possible to improve the filling quality of a subsequent spacer and the electrical properties of the resultant shallow trench isolation region.

In the present method for planarizing an etched surface of silicon substrate, after a silicon substrate is etched, an isotropic plasma etching process is performed on the etched silicon substrate by using a mixed gases containing a fluorine-based gas and oxygen gas, so that a temporary protective film of SiOF is formed from the fluorine-based gas and oxygen gas on the surface of the etched silicon substrate during the isotropic plasma etching process, and the thickness of the temporary protective film which covers the surface of the silicon substrate increases gradually from the convex portion of the surface of the silicon substrate to the concave portion of the surface of the silicon substrate, wherein the convex portion of the surface of the silicon substrate is etched by the mixed gases containing the fluorine-based gas and oxygen gas more easily as compared with the concave portion of the surface of the silicon substrate. The difference of height between the convex portion and the concave portion of the surface of the silicon substrate is reduced after the isotropic plasma etching process, thereby improving the etching uniformity of the etched surface of the silicon substrate.

DESCRIPTION OF SPECIFIC EMBODIMENTS

The above objects, features and advantages of the present invention will become better understood with respect to the following description of the preferred embodiments given in conjunction with the accompanying drawings. The accompanying drawings are merely illustrative and may not be drawn to scale.

The description in detail hereinafter is intended to provide a complete understanding of the present invention. However many other embodiments may be performed by those skilled in the art upon reviewing the disclosure without departing from the scope and spirit of the appended claims.

Figure 1A:
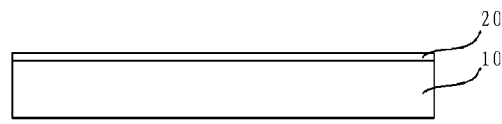
FIGS. 1a to 1d are schematic views illustrating a method for forming a gate according to the related art.
Figure 1B:
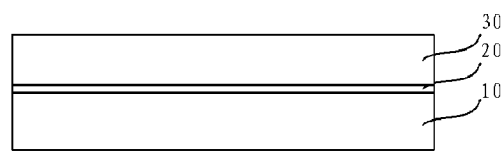
Figure 1C:
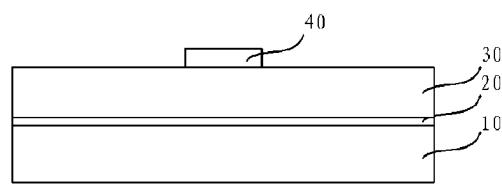
Figure 1D:
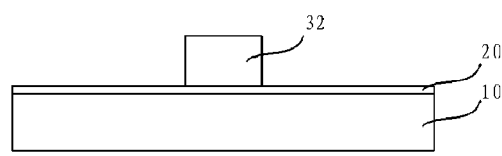
Figure 1E:
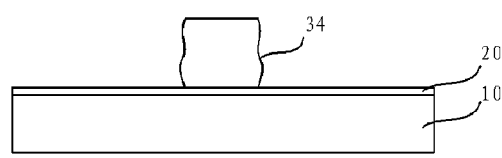
FIG. 1e is a structure schematic view illustrating a gate having roughness defects on sidewalls according to the related art.
Figure 2A:
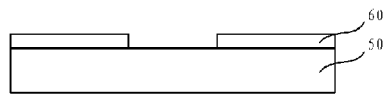
FIGS. 2a and 2b are schematic views illustrating a method for forming a shallow trench according to the related art.
Figure 2B:
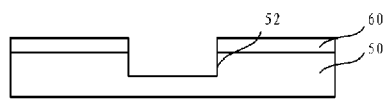
Figure 2C:
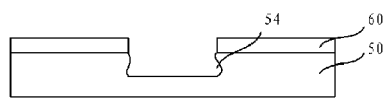
FIG. 2c is a structure schematic view illustrating a shallow trench having an etched interface with roughness defects on sidewalls and bottom according to the related art.
Figure 3:
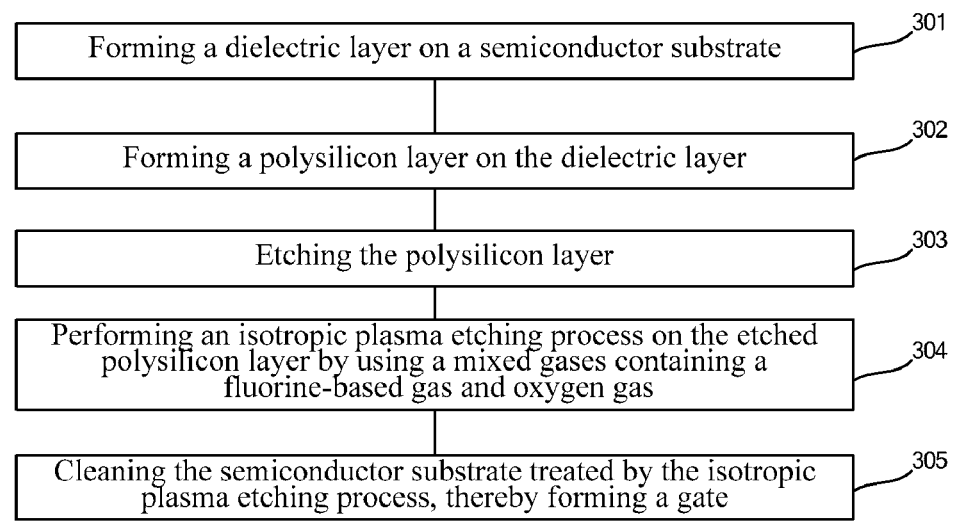
FIG. 3 is a flow diagram illustrating a method for forming a gate according to an embodiment of the present invention.
Figure 4A:
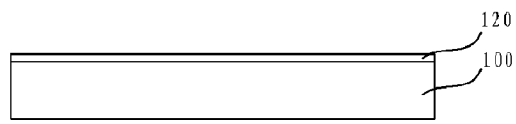
FIGS. 4a to 4e are schematic views illustrating a method for forming a gate according to an embodiment of the present invention.

As shown in FIG. 3, the method for forming a gate according to the present invention comprises the following steps:

step 301: forming a dielectric layer 120 on a semiconductor substrate 100, as shown in FIGS. 3 and 4a.

An active region of device has been defined and a shallow trench isolation has been accomplished in the semiconductor substrate 100. The semiconductor substrate comprises, but not limited to, silicon material such as silicon or silicon germanium (SiGe) having a monocrystalline, polycrystalline, or amorphous structure, or silicon on insulator (SOI).

The dielectric layer comprises silicon oxide as a gate dielectric layer of a resultant semiconductor device. The oxide layer can be obtained by using a thermal oxidation process, and the thermal oxidation process can be performed in a high temperature oxidation apparatus or an oxidation furnace. The process for forming the oxide layer can comprise the steps of thermal oxidation and detection. Particularly, the oxide layer can be formed by any well known process in the art.

Figure 4B:
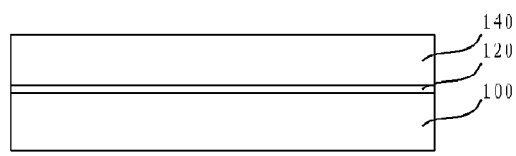

Step 302: forming a polysilicon layer 140 on the dielectric layer 120, as shown in FIGS. 3 and 4b.

The polysilicon layer 140 can be formed by using a low pressure chemical vapor deposition (LPCVD) process. The polysilicon layer 140 can be formed at the following process conditions in that the reaction gas is silane ($SiH_4$); the flow rate of silane can be in a range of 100~200 ml/min (sccm), such as 150 sccm; the temperature of the reaction chamber can be in a range of 700~750° C.; the pressure in the reaction chamber can be in a range of 250~350 millitorr (mTorr), such as 300 mTorr; the reaction gas can further comprise a buffer gas, such as helium (He) gas or nitrogen gas; and the flow rates of the helium gas and nitrogen gas can be in a range of 5~20 liter/min (slm), such as 8 slm, 10 slm or 15 slm.

Figure 4C:
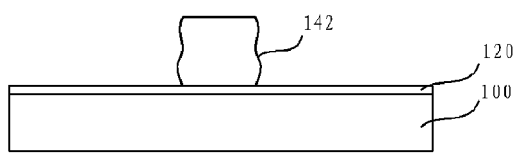

Step 303: etching the polysilicon layer 140, as shown in FIGS. 3 and 4c.

The polysilicon layer 140 can be etched by using a plasma etching process.

It is found that the roughness defects 142 are usually formed on the sidewalls of the etched polysilicon layer 140 and they can affect the precise controlling for a width of the gate negatively. How to reduce the roughness and improve the etching uniformity of sidewalls of the gate has become a major problem in the art.

Figure 4D:
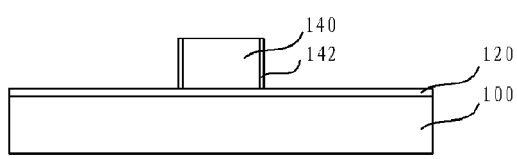
Figure 4E:
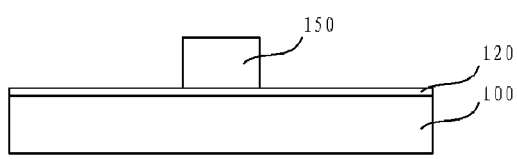

Step 304: performing an isotropic plasma etching process on the etched polysilicon layer 140 by using a mixed gases containing a fluorine-based gas and oxygen gas, as shown in FIGS. 3 and 4d.

The etching process is used to remove a convex portion of the surface of the etched polysilicon layer 140, wherein the fluorine-based gas is used to remove the convex polysilicon, and the resulting byproducts from which is removed by the oxygen gas contained in the mixed gases.

The fluorine-based gas can be one or more selected from $CF_4$, $C_2F_6$, $SF_6$ and $NF_3$. For example, the etching process can be performed at the following process conditions in that the fluorine-based gas comprises $CF_4$; the flow rate of $CF_4$ is in a range of 10~50 sccm, such as 20 sccm, 30 sccm or 40 sccm; the flow rate of the oxygen gas is in a range of 100~300 sccm, such as 120 sccm, 150 sccm, 180 sccm or 250 sccm; the reaction pressure is in a range of 100~500 mT, such as 200 mT, 225 mT or 350 mT; and the reaction power is in a range of 300~500 W, such as 350 W or 400 W.

Figure 5A:
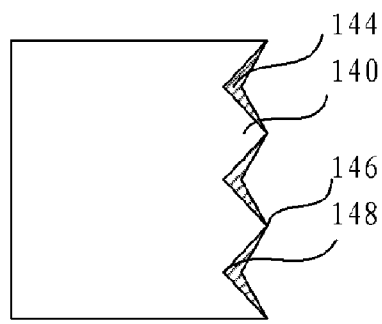
FIGS. 5a to 5c are schematic views illustrating an isotropic plasma etching process according to an embodiment of the present invention.
Figure 5B:
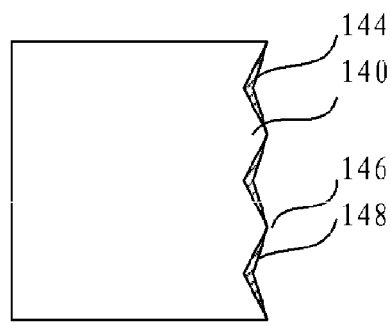

In the above method for forming a gate, after the polysilicon layer 140 is etched, an isotropic plasma etching process is performed on the etched polysilicon layer by using a mixed gases containing a fluorine-based gas and oxygen gas, so that a temporary protective film 144 of SiOF is formed from the fluorine-based gas and oxygen gas on the surface of the etched polysilicon layer during the isotropic plasma etching process, as shown in FIG. 5a. The thickness of the temporary protective film 144 which covers the surface of the polysilicon layer 140 increases gradually from the convex portion 146 of the surface of the polysilicon layer to the concave portion 148 of the surface of the polysilicon layer, wherein the convex portion 146 of the surface of the polysilicon layer is etched by the mixed gases containing the fluorine-based gas and oxygen more easily as compared with the concave portion 148 of the surface of the polysilicon layer. The difference of height between the convex portion 146 and the concave portion 148 of the surface of the polysilicon layer is reduced after the isotropic plasma etching process, as shown in FIG. 5b, thereby improving the etching uniformity of the gate sidewalls.

Figure 5C:
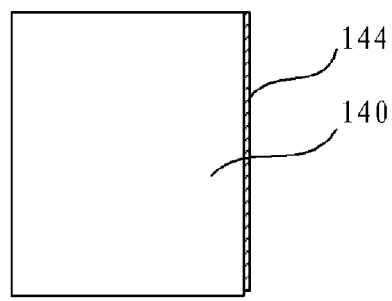

As shown in FIGS. 5c and 4d, after the above etching operation, the temporary protective film 144 of SiOF covers the surface of the polysilicon layer 140 and a conventional cleaning process can be used to remove the temporary protective film 144 of SiOF, thereby forming a gate.

Step 305: cleaning the semiconductor substrate 100 subjected to the isotropic plasma etching process, thereby forming a gate 150.

Preferably, the cleaning process can be performed by using a wet cleaning process.

The wet cleaning process is performed by the following steps in that cleaning the semiconductor substrate subjected to the isotropic plasma etching process by using a mixed aqueous solution of sulfuric acid and hydrogen peroxide or a mixed aqueous solution of sulfuric acid and ozone; and cleaning the resultant semiconductor substrate by using a mixed aqueous solution of ammonia and hydrogen peroxide.

The mixed aqueous solution of sulfuric acid and hydrogen peroxide can be SPM; the mixed aqueous solution of sulfuric acid and ozone can be SOM; and the mixed aqueous solution of ammonia and hydrogen peroxide can be SC1.

The present inventor have proved that as for a 65 nanometers (nm) process node, the size of the sidewalls roughness defects of the gate formed by the above method according to the present invention can decrease from 6 nm to 3 nm.

It is noted that the isotropic plasma etching process can be inductively coupled plasma (ICP) process with a zero bias power. The bias power is set at zero so that no electrical field is formed on the surface of the semiconductor substrate when the semiconductor substrate is etched by using the ICP process, and orientation movement of the plasma can not be achieved on the surface of the semiconductor substrate, thereby facilitating the isotropic plasma etching process.

Preferably, the ICP process is performed in the CED300 apparatus manufactured by SHIBAURA Co., and the CED300 apparatus is commonly used in an oxygen-based stripping process in the art.

Figure 6:
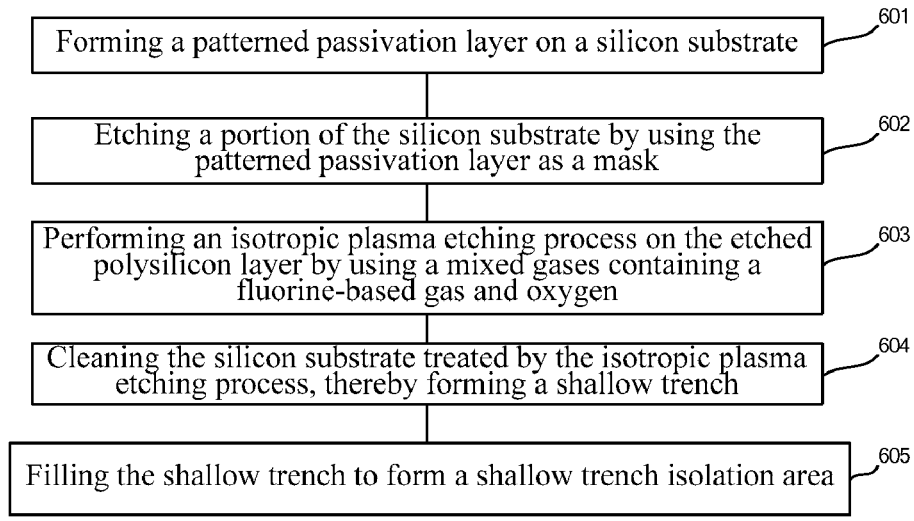
FIG. 6 is a flow diagram illustrating a method for forming a shallow trench according to an embodiment of the present invention.
Figure 7A:
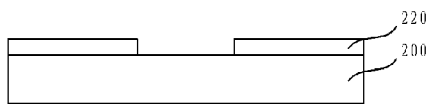
FIGS. 7a to 7d are schematic views illustrating a method for forming a shallow trench according to an embodiment of the present invention.

As shown in FIG. 6, the method for forming a shallow trench isolation region according to the present invention comprises the following steps:

Step 601: forming a patterned passivation layer 220 on a silicon substrate 200, as shown in FIGS. 6 and 7a.

An active region of device has been defined and a shallow trench isolation has been accomplished in the semiconductor substrate 200.

The passivation layer 220 can be obtained by reacting ammonia gas with dichlorosilane to form silicon nitride ($Si_3N_4$) at a high temperature (such as 750° C.) in a low pressure chemical vapor deposition (LPCVD) apparatus. The passivation layer 220 can be made of, but not limited to, one selected from silicon nitride, silicon oxynitride (SiON), silicon carbide (SiC), silicon carbide-oxide (SiCO) and silicon carbide-nitride (SiCN), or a combination thereof. The process for forming the passivation layer 220 can comprise the steps of deposition, grinding, detection and so on as the well known processes in the art.

Figure 7B:
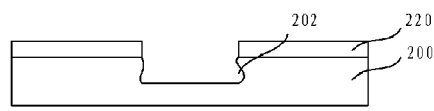

Step 602: etching a portion of the silicon substrate 200 by using the patterned passivation layer 220 as a mask, as shown in FIGS. 6 and 7b.

It is found that the roughness defects 202 are usually formed on the surface of the silicon substrate 200 and they can affect the precise controlling for width and depth of the shallow trench negatively. How to reduce the roughness and improve the etching uniformity of sidewalls and bottom of the etched interface formed during the forming of the shallow trench has become a major problem in the art.

Step 603: performing an isotropic plasma etching process on the etched silicon substrate 200 by using a mixed gases containing a fluorine-based gas and oxygen gas as shown in FIGS. 6 and 7b.

The etching process is used to remove a convex portion of the surface of the silicon substrate 200, wherein the fluorine-based gas is used to remove the convex silicon and the resulting byproducts from which is removed by the oxygen gas contained in the mixed gases.

The fluorine-based gas can be one or more selected from $CF_4$, $C_2F_6$, $SF_6$ and $NF_3$. For example, the etching process can be performed at the following process conditions in that the fluorine-based gas comprises $CF_4$; the flow rate of $CF_4$ is in a range of 10~50 sccm, such as 20 sccm, 30 sccm or 40 sccm; the flow rate of the oxygen gas is in a range of 100~300 sccm, such as 120 sccm, 150 sccm, 180 sccm or 250 sccm; the reaction pressure is in a range of 100~500 mT, such as 200 mT, 225 mT or 350 mT; and the reaction power is in a range of 300~500 W, such as 350 W or 400 W.

Figure 8A:
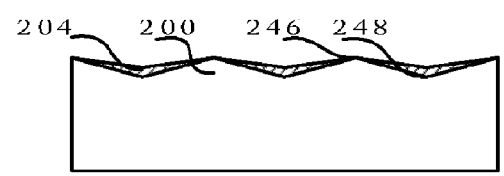
FIGS. 8a to 8c are schematic views illustrating an isotropic plasma etching process according to an embodiment of the present invention.
Figure 8B:
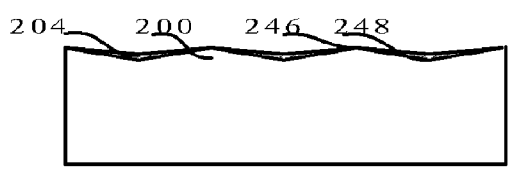

In the above method for forming a shallow trench, after the silicon substrate 200 is etched, an isotropic plasma etching process is performed on the etched the silicon substrate 200 by using a mixed gases containing a fluorine-based gas and oxygen gas, so that a temporary protective film 204 of SiOF is formed from the fluorine-based gas and oxygen gas on the etched interface of the silicon substrate 200 during the isotropic plasma etching process, as shown in FIG. 8a. The thickness of the temporary protective film 204 which covers the etched interface of the silicon substrate 200 increases gradually from the convex portion 246 of the etched interface to the concave portion 248 of the etched interface, wherein the convex portion 246 of the etched interface is etched by the mixed gases containing the fluorine-based gas and oxygen gas more easily as compared with the concave portion 248 of the etched interface. The difference of height between the convex portion 246 and the concave portion 248 of the etched interface is reduced after the isotropic plasma etching process, as shown in FIG. 8b, thereby improving the etching uniformity of the silicon substrate.

Figure 7C:
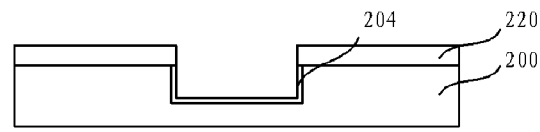
Figure 7D:
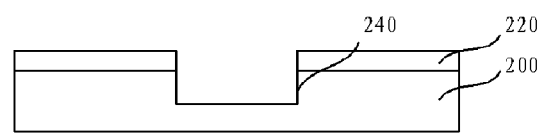
Figure 8C:
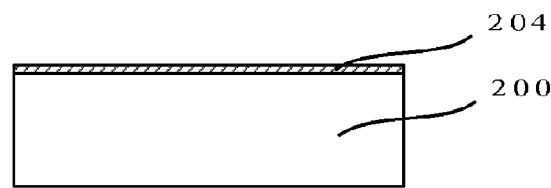

As shown in FIGS. 8c and 7c, after the above etching processes, the temporary protective film 204 of SiOF covers the surface of the silicon substrate 200, and a conventional cleaning process can be used to remove the temporary protective film 204 of SiOF, thereby forming a shallow trench.

Step 604: cleaning the silicon substrate subjected to the isotropic plasma etching process, thereby forming a shallow trench 240.

Preferably, the cleaning process can be performed by using a wet cleaning process.

The wet cleaning process is performed by the following steps of cleaning the silicon substrate subjected to the isotropic plasma etching process by using a mixed aqueous solution of sulfuric acid and hydrogen peroxide or a mixed aqueous solution of sulfuric acid and ozone, and then cleaning the resultant semiconductor substrate by using a mixed aqueous solution of ammonia and hydrogen peroxide.

The mixed aqueous solution of sulfuric acid and hydrogen peroxide can be SPM; the mixed aqueous solution of sulfuric acid and ozone can be SOM; and the mixed aqueous solution of ammonia and hydrogen peroxide can be SC1.

The present inventor have proved that as for a 65 nanometers (nm) process node, the size of the roughness defects on the surface of the silicon substrate 200 formed by the above method according to the present invention can decrease from 6 nm to 3 nm.

It is noted that the isotropic plasma etching process can be inductively coupled plasma (ICP) process with a zero bias power. The bias power is set at zero so that no electrical field is formed on the surface of the silicon substrate 200 when the silicon substrate 200 is etched by using the ICP process, and orientation movement of the plasma can not be achieved on the surface of the silicon substrate 200, thereby facilitating the isotropic plasma etching process.

Preferably, the ICP process is performed in the CED300 apparatus manufactured by SHIBAURA Co., and the CED300 apparatus is commonly used in an oxygen-based stripping process in the art.

Step 604: filling the shallow trench 240 to form a shallow trench isolation region.

The shallow trench 240 can be filled by depositing an isolation layer therein. Conventionally, the isolation layer is formed by a depositing-etching-depositing process which is performed by a high density plasma (HDP) chemical vapor deposition process.

The depositing-etching-depositing process includes the following steps: depositing a portion of the isolation layer;

then etching a portion of the formed isolation layer; and subsequently depositing another isolation layer, thereby forming the isolation layer.

Depositing the isolation layer in the shallow trench 240 further includes a step of forming a pad oxide layer in advance. The pad oxide layer can be formed by using a thermal oxidation process or in situ steam generation (ISSG) process. The step of forming the pad oxide layer can restore the damage to crystal lattice of semiconductor substrate due to forming the shallow trench, and reduce the damage to the sidewalls and bottom of the shallow trench caused by plasma during the subsequent deposition process.

Figure 9:
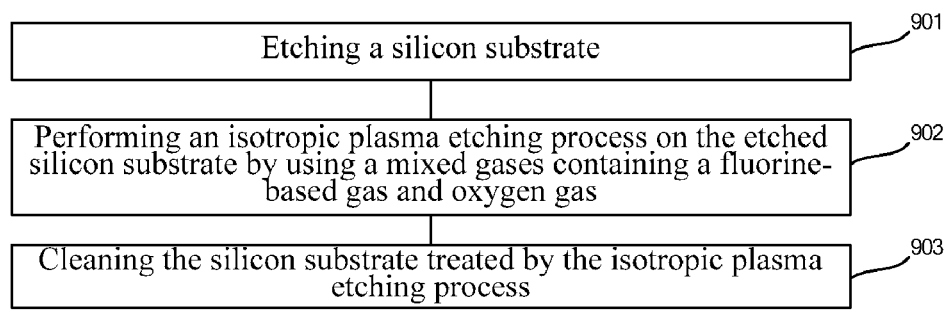
FIG. 9 is a flow diagram illustrating a method for planarizating an etched surface of silicon substrate according to an embodiment of the present invention.

Furthermore, as shown in FIG. 9, a method for planarizating an etched surface of silicon substrate comprising the following steps:

Step 901: etching a silicon substrate;

Step 902: performing an isotropic plasma etching process on the etched silicon substrate by using a mixed gases containing a fluorine-based gas and oxygen gas;

Step 903: cleaning the silicon substrate subjected to the isotropic plasma etching process.

The fluorine-based gas can be one or more selected from $CF_4$, $C_2F_6$, $SF_6$ and $NF_3$. For example, the etching process can be performed at the following process conditions in that the fluorine-based gas comprises $CF_4$; the flow rate of $CF_4$ is in a range of 10~50 sccm, such as 20 sccm, 30 sccm or 40 sccm; the flow rate of the oxygen gas is in a range of 100~300 sccm, such as 120 sccm, 150 sccm, 180 sccm or 250 sccm; the reaction pressure is in a range of 100~500 mT, such as 200 mT, 225 mT or 350 mT; and the reaction power is in a range of 300~500 W, such as 350 W or 400 W.

The isotropic plasma etching process can be inductively coupled plasma (ICP) process with a zero bias power. The ICP process can be performed in the CED300 apparatus manufactured by SHIBAURA Co., and the cleaning can be performed by using a wet cleaning process.

The wet cleaning process includes the following steps:

cleaning the silicon substrate subjected to the isotropic plasma etching process by using a mixed aqueous solution of sulfuric acid and hydrogen peroxide or a mixed aqueous solution of sulfuric acid and ozone; and cleaning the resultant semiconductor substrate by using a mixed aqueous solution of ammonia and hydrogen peroxide.

In the above method for planarizating an etched surface of silicon substrate, after the silicon substrate is etched, an isotropic plasma etching process is performed on the etched silicon substrate by using a mixed gases containing a fluorine-based gas and oxygen gas, so that a temporary protective film of SiOF is formed from the fluorine-based gas and oxygen gas on the surface of the etched silicon substrate during the isotropic plasma etching process. The thickness of the temporary protective film which covers the surface of the silicon substrate increases gradually from the convex portion of the surface of the silicon substrate to the concave portion of the surface of the silicon substrate, wherein the convex portion of the surface of the silicon substrate is etched by the mixed gases containing the fluorine-based gas and oxygen more easily as compared with the concave portion of the surface of the silicon substrate. The difference of height between the convex portion and the concave portion of the surface of the silicon substrate is reduced after the isotropic plasma etching process, thereby improving the etching uniformity of the surface of the etched silicon substrate.

It is noted that all the steps without describing in details herein can be performed according to any well known process, and the process parameters of which can be determined by the specific requirements for the products and the specific process conditions.

While the present invention has been described with respect to certain preferred embodiments, it will be apparent to those skilled in the art that various changes and modifications may be made without departing from the spirit and scope of the invention as defined in the following claims. Accordingly, the detailed descriptions and the drawings are to be regarded as illustrative rather than restrictive. The appended claims and their equivalents are intended to cover all such modifications, enhancements, and other embodiments, which fall within the spirit and scope consistent with the present invention.

What is claimed is:

1. A method for planarizating an etched surface of silicon substrate comprising the following steps:

etching a silicon substrate;

immediately after the silicon substrate is etched, performing an isotropic plasma etching process on the etched silicon substrate by using a mixed gases containing a fluorine-based gas and oxygen gas; and cleaning the silicon substrate treated by the isotropic plasma etching process;

wherein, by using a mixed gases containing a fluorine-based gas and oxygen gas, a temporary protective film of SiOF is formed on surface of the etched silicon substrate during the isotropic plasma etching process, and thickness of the temporary protective film of SiOF increases gradually from convex portion of the surface of the silicon substrate to concave portion of the surface of the silicon substrate, thereby improving the etching uniformity of the surface of the etched silicon substrate.

2. The method for planarizating an etched surface of silicon substrate according to claim 1, wherein the fluorine-based gas is one or more selected from $CF_4$, $C_2F_6$, $SF_6$ and $NF_3$.

3. The method for planarizating an etched surface of silicon substrate according to claim 1, wherein the fluorine-based gas is $CF_4$, and the flow rate of the $CF_4$ is in a range of 10 sccm to 50 sccm.

4. The method for planarizating an etched surface of silicon substrate according to claim 1, wherein the flow rate of oxygen gas is in a range of 100 sccm to 300 sccm.

5. The method for planarizating an etched surface of silicon substrate according to claim 1, wherein the isotropic plasma etching process can be performed by using an inductive coupled plasma process with a zero bias power.

6. The method for planarizating an etched surface of silicon substrate according to claim 1, wherein the isotropic plasma etching process is performed under a pressure ranging from 200 mTorr to 300 mTorr.

7. The method for planarizating an etched surface of silicon substrate according to claim 1, wherein the isotropic plasma etching process is performed at a power ranging from 200 W to 1000 W.

8. The method for planarizating an etched surface of silicon substrate according to claim 1, wherein the cleaning process is performed by using a wet cleaning process.

9. The method for planarizating an etched surface of silicon substrate according to claim 1 or 8, wherein the cleaning process is performed by the following steps:

cleaning the silicon substrate subjected to the isotropic plasma etching process by using a mixed aqueous solution of sulfuric acid and hydrogen peroxide or a mixed aqueous solution of sulfuric acid and ozone; and cleaning the resultant silicon substrate by using a mixed aqueous solution of ammonia and hydrogen peroxide.

* * * * *